United States Patent [19]

Ichimura et al.

[11] Patent Number: 4,760,333
[45] Date of Patent: Jul. 26, 1988

[54] CROSSED COIL METER HAVING CONCENTRICALLY WOUND MAGNETIC SHIELD

[75] Inventors: Etsuo Ichimura; Sakae Tsuyukubo; Kouji Kurihara, all of Saitama, Japan

[73] Assignee: Kanto Seiki Co., Ltd., Omiya, Japan

[21] Appl. No.: 795,330

[22] Filed: Nov. 6, 1985

[30] Foreign Application Priority Data

| Dec. 13, 1984 | [JP] | Japan | 59-189438[U] |
| Jan. 11, 1985 | [JP] | Japan | 60-2226[U] |
| Mar. 7, 1985 | [JP] | Japan | 60-32699[U] |
| Jun. 19, 1985 | [JP] | Japan | 60-92555[U] |

[51] Int. Cl.$^4$ .............................................. G01R 1/04
[52] U.S. Cl. ...................................... 324/143; 324/156
[58] Field of Search ............... 324/143, 156, 157, 142; 336/84 R, 84 M; 174/35 R, 35 CE; 307/89, 91; 333/12

[56] References Cited

U.S. PATENT DOCUMENTS

| 2,710,377 | 6/1955 | Pfeffer | 324/156 |
| 2,970,267 | 1/1961 | Pfeffer | 324/156 |
| 3,502,984 | 3/1970 | Mincuzzi | 324/157 |
| 3,856,513 | 12/1974 | Chen et al. | 75/122 |
| 4,189,618 | 2/1980 | Bretts et al. | 336/84 M |

Primary Examiner—Reinhard J. Eisenzopf
Assistant Examiner—Jack B. Harvey
Attorney, Agent, or Firm—Foley & Lardner, Schwartz, Jeffery, Schwaab, Mack, Blumenthal & Evans

[57] ABSTRACT

A meter of the type having crossed coils, comprises an outer body having a cylindrical wall surrounding the coils, and an insert of an amorphous metal alloy that is disposed in a cylindrical bore defined by the wall. The insert surrounds the coils and is formed by rolling a strip of plate made of amorphous metal alloy. This construction provides an effective magnetic shield.

9 Claims, 3 Drawing Sheets

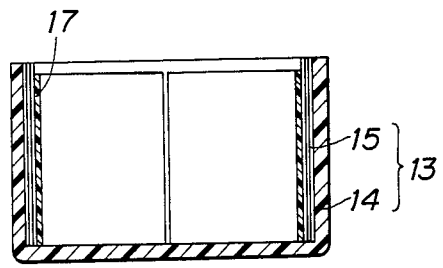
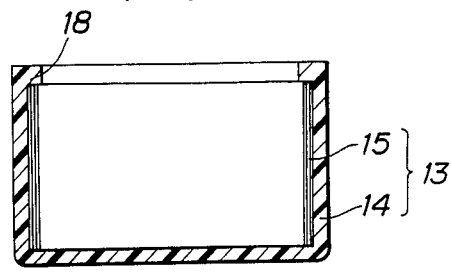
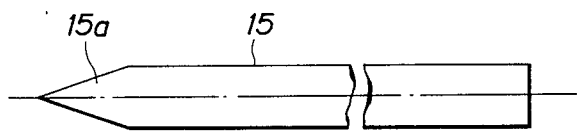
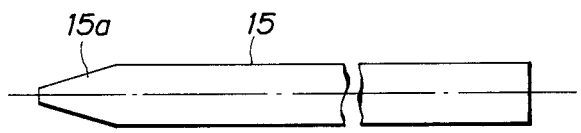
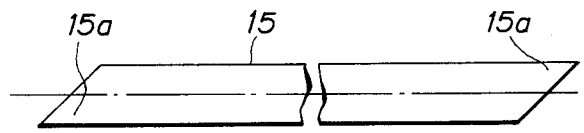
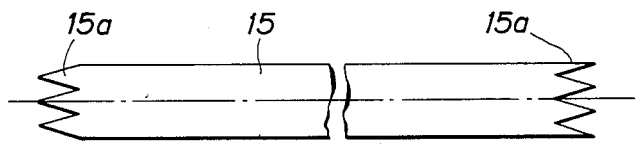

CROSSED COIL METER HAVING CONCENTRICALLY WOUND MAGNETIC SHIELD

BACKGROUND OF THE INVENTION

1. Field of the Invention

The present invention relates to a meter of the type having crossed coils.

2. Description of the Prior Art

Meters of the type having crossed coils are well known and comprise a magnet, a pointer shaft having one end extending through the magnet at a center portion thereof and attached thereto for integral rotation, a pointer attached to the opposite end of the shaft, a pair of upper and lower housings, each being made of a non-magnetic material, such as a plastic, which mate with each other to rotatably carry the magnet and the pointer shaft, a pair of crossed coils winding the housings and placed crosswise, a cup-shaped magnetic shield fixedly attached to the lower housing in such a manner as to surround the coils, and a dial fixedly attached to arms of the upper housing. The magnetic shield case is provided to protect the coils against an external magnetic field, and it is made of a soft magnetic material having a relatively high coercive force, such as an electromagnetic soft iron (SUY) or a pure iron containing 1% silicon (Si). Because of the material used, the magnetic flux density that remains in the magnetic shield case after the removal of an applied magnetomotive force (i.e., remanence) is considerably high. Thus, if the electric current passing through the coils is cut off while the meter is in operation, the magnet moves to turn the pointer slightly from a position where the pointer was positioned immediately before the removal of the current supply. The remanence in the magnetic shield case also effects the angle of rotation of the magnet even while the meter is in operation, causing a change in the pointing angle of the pointer. To alleviate the above mentioned problems, there is an idea to use a magnetic shield case formed, by drawing, from a blank of a sheet of a material having a low coercive force, such as Permalloy (registered trade mark) containing lead (Pb). However, the use of the Permalloy-Pb alloy as the material of the magnetic shield case causes a considerable cost increase in manufacturing the meters because this alloy is expensive.

SUMMARY OF THE INVENTION

According to the present invention, a meter is provided which employs an effective magnetic shield and which is inexpensive to manufacture.

More particularly, according to the present invention, a meter comprises an outer body having a wall defining a bore and surrounding a plurality of crossed coils mounted around a magnet rotatable with a pointer shaft. An insert held in the bore defined by the wall and surrounds the coils. The insert is formed from a strip of plate made of an amorphous metal alloy by curling the strip of plate.

The outer body is made of a non-magnetic material or a magnetic material that has a coercive force higher than a certain level.

The outer body may take the form of a cup-shape and it may be formed, by drawing, from a blank of a magnetic material. In this case, the magnet annealing which is usually employed for elimination of residual stress occurring during the process of forming may be dispensed with.

Preferably, the strip of plate has one end so shaped as to gradually reduce the structural rigidity toward the margin thereof, so that it makes a cylindrical body after curling it with this end disposed inside and then inserting into the bore defined by the wall of the outer body.

In order to simplify the assembly work in an attempt to bring down the manufacturing cost of the meters, it is preferrable that the outer body includes an integral substrate. The substrate has formed on one side thereof a cylindrical projection formed with the above mentioned wall. On the opposite side of the substrate, a recess is formed for receiving a wiring board. In this case, the outer body is made of a synthetic resin.

An object of the present invention is to improve a meter of the type having crossed coils such that the pointer remains accurately in the same position before and after electric current passing through the coils is cut off during the operation of the meter and the pointer always assumes the same pointing angle for the same amount of electric current passing through the coils, and at the same time the manufacturing cost is reduced.

BRIEF DESCRIPTION OF THE DRAWINGS

FIG. 3 is a sectional view of a modified magnetic shield usable in the meter shown in FIG. 1

FIG. 4 is a similar view to FIG. 3 showing another modified magnetic shield usable in the meter shown in FIG. 1

FIGS. 5 to 9 are top plan views, each showing a strip of plate in its flat state;

DESCRIPTION OF THE EMBODIMENTS

Figure 1:
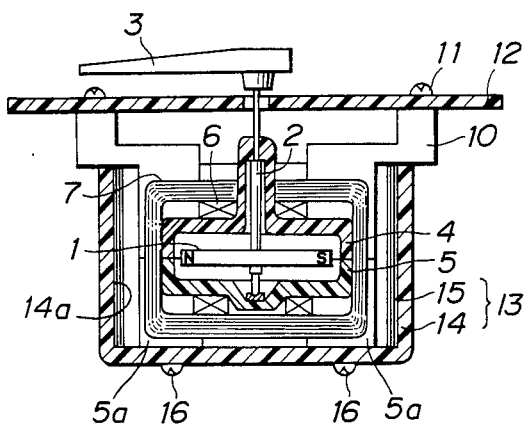
FIG. 1 is a sectional view of an embodiment of a meter according to the present invention.
Figure 1A:
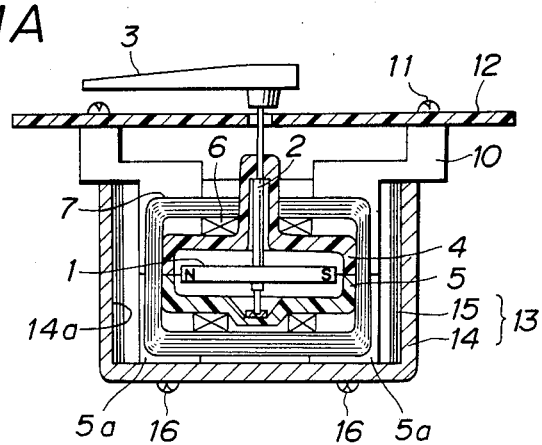
FIG. 1A is a similar view to FIG. 1 showing a modification of the meter shown in FIG. 1.

Referring to FIG. 1, there is shown a meter of the type having crossed coils. It comprises a magnet 1, and a pointer shaft 2. The pointer shaft 2 has one end extending through the magnet 1 at its center portion and attached to same for integral rotation. To the opposite end of the shaft 2 is attached a pointer 3. The shaft 2 is rotatably carried by a pair of upper and lower housings 4 and 5, each being made of a non-magnetic material, such as a plastic. The pair of upper and lower housings 4 and 5 mate with each other and define a chamber receiving therein the above mentioned magnet 1. A plurality, a pair in this embodiment, of coils 6 and 7 wind the housings 4 and 5 and they are crossed. To protect the coils 6 and 7 against an external magnetic field, a magnetic shield as denoted by the reference numeral 13 is provided. The magnetic shield 13 comprises a cup-shaped outer body 14 made of a non-magnetic material, such as a synthetic resin. This cup-shaped outer body 14 may be made of a magnetic material that has a relatively high coercive force, such as a low cost iron plate like SPCC, SPCD, SPCE as shown in FIG. 1A. The cup-shaped outer body 14 has a cylindrical wall 14a defining a cylindrical bore having lower end enclosed as viewed in FIG. 1 and is attached to pillars 5a of the lower housing 5 by means of a plurality of screws 16 so that the coils 6 and 7 are received in the cylindrical bore and surrounded by the cylindrical wall 14a. The magnetic shield 13 also comprises a cylindrical insert formed from a strip of plate 15 made of an amorphous metal alloy.

Figure 2:
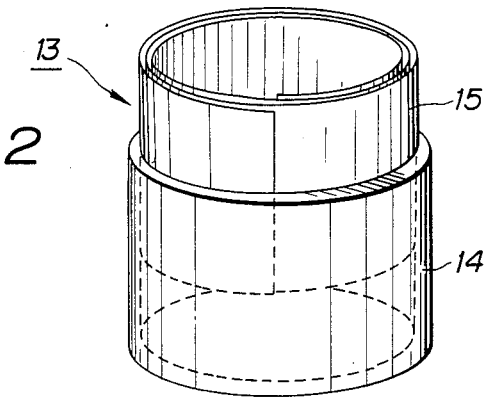
FIG. 2 is a perspective exploded view of a magnetic shield of the meter shown in FIG. 1.

The process of forming the strip of plate 15 is explained briefly. Metals selected from a group including iron, cobalt and nickel and semimetals selected from a group including silicon and boron are melted with each other, and then this molten metal is subject to a rapid quenching on cooling rolls to produce a thin tape having a thickness of 30 microns, for example. The strip of plate 15 is cut from this tape of amorphous metal alloy. The strip of plate 15 is curled into a cylindrical body, inserted into the bore defined by the cylindrical wall 14a, and held in engagement with the wall 14a of the outer body 14 (see FIG. 2 also).

The amorphous metal alloys are described in U.S. Pat. No. 3,856,513 issued to Chen et al. on Dec. 24, 1974. According to this U.S. patent, the compositions are represented by the general formula:

$$M_a Y_b Z_c$$

wherein M is a metal selected from one or more of the group consisting of Fe, Ni, Co, V and Cr; Y represents elements from the group consisting of P, B, and C; Z represents elements from the group consisting of Al, Si, Sn. Ge, In, Sb or Be; and a, b, and c are in atomic percent and range from about 60 to 90, about 10 to 30 and about 0.1 to 1.5, respectively, and a plus b and c equals 100. The amorphous metal alloys include, for example, $Fe_{78}B_{10}Si_{12}$, $Fe_{67}Co_{18}B_{14}Si_1$, $C_{73}Si_{15}B_{12}$ or $Ni_{78}Si_{10}B_{12}$. The production of amorphous metal alloys requires rapid quenching of the molten liquid of the above composition on cooling rolls at a cooling rate ranging from $10^5°$–$10^6°$ C./sec.

In the case the cup-shaped outer body 14 is formed, by drawing, from a blank of a magnetic material (see FIG. 1A), the magnet annealing which is usually employed for elimination of residual stress that occurs during the process of forming may be dispensed with. This contributes much to a cost reduction if it is desired to do so. The strip of plate 15 may be used without being subject to the magnet annealing. This also contibutes to a cost reduction in manufacturing the meters.

The magnetic shield 13 described in the preceding provides effective magnetic shield owing to the cylindrical insert 15 formed from the strip of plate made of amorphous alloy. Thus, it is ensured that the pointer 3 remains accurately in the same position before and after electric current passing through the coils 6 and 7 is cut off during the operation of the meter and the pointer 3 always assumes the same pointing angle for the same amount of electric current passing through the coils 6 and 7. It is also to be appreciated that the magnetic shild 13 uses the outer body 14 made of a low cost material. It is also to be appreciated that the strip of plate 15 is cut from the thin belt of amorphous alloy without any loss. As a result, the magnetic shield 13 discussed above makes much contribution to cost reduction in manufacturing the meters.

The strip of plate 15 maintains its engagement with the cylindrical wall 14a due to the reaction to the bending stress applied thereto and thus held within the bore defined by the cylindrical wall 14a of the outer body 14. If it is desired to ensure this engagement, a ring 17, made of a non-magnetic material such as a synthetic resin, may be placed inside the wall 14a as shown in FIG. 3. in such a manner as to press the strip of plate 15 into firm engagement with the wall 14a.

If it is desired to prevent the strip of plate 15 from slipping out of the bore defined by the wall 14a of the outer body 14, projecting means 18 may be formed from the open end of the outer body 14 as shown in FIG. 4. The projecting means 18 may be provided in addition to the provision of the pressing ring 17.

If the inner end of the strip of plate 15 is disengaged away inwardly, an adheasive may be used to fixedly engage this curled inner end with the adjacent portion of the strip of plate 15.

Referring to FIGS. 5 to 9, five different strips of plate are described. The common feature of these different designs resides in the shape of one end 15a of the strip of plate 15 which gradually reduces the structural rigidity toward the end margin thereof. This design permits the strip of plate 15 to make a cylinder after it has been curled and inserted into the bore defined by the cylindrical wall 14a of the outer body 14.

Referring to FIG. 5, one end 15a of a strip of plate 15 is so shaped as to reduce the width towards the end margin thereof. In other words, the one end 15a of the strip of plate 15 is tapered as viewed in FIG. 5. In curling the strip of plate 15, this tapered end 15a is disposed inside.

Referring to FIG. 6, one end 15a of a strip of plate 15 is tapered similarly to FIG. 5. But, this design is different from FIG. 5 in that the tapered end is flat. Similarly to the example shown in FIG. 5, the one end 15a is disposed inside when the strip of plate 15 is curled into the cylindrical shape.

Referring to FIG. 7, both ends of a strip of plate 15 are cut out to form parallel slopes as denoted by reference numerals 15a. Referring to FIG. 8, both ends of a strip of plate 15 are cut out to form serrations or toothlike projections as denoted by reference numerals 15a.

Referring to FIG. 9, one end of a strip of plate 15 is tapered and the opposite end thereof is notched into a shape mating with the projected taper as denoted by reference numerals 15a.

In the cases of FIGS. 7, 8, and 9, since both of the ends of the strip of plate 15 are shaped to gradually reduce the structural rigidity towards the marginal ends, the strip of plate 15 makes substantially a true cylindrical shape after being curled and inserted into the bore defined by the cylindrical wall 14a of the outer body 14.

Figure 10:
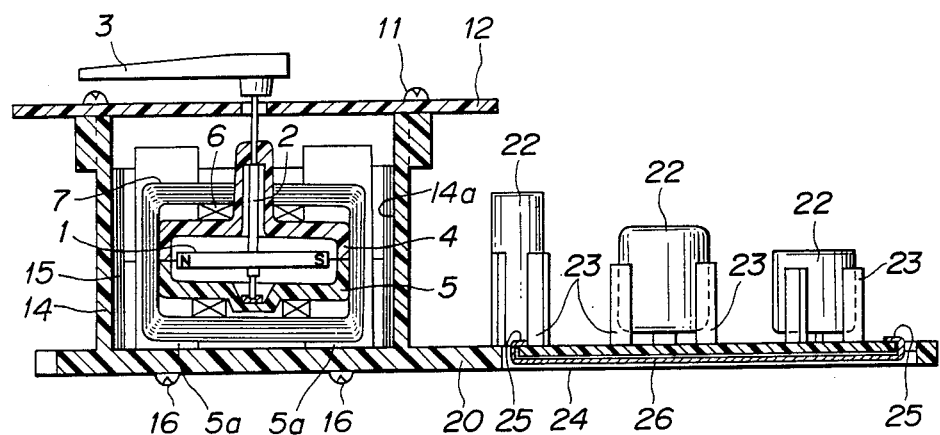
FIG. 10 is a sectional view of another embodiment of a meter according to the present.
Figure 11:
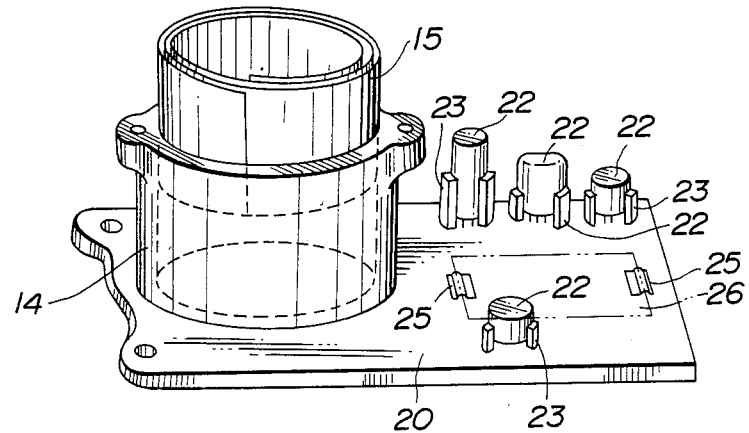
FIG. 11 is a perspective view of the meter shown in FIG. 10 with the magnetic shield shown as being exploded.

Referring to FIGS. 10 and 11, there is described an effective measure to further reduce a cost in manufacturing the meters. Briefly, according to this embodiment, an outer body 14 has an integral substrate 20 for a wiring board to which various electrical components, as denoted by the reference numerals 22, of a meter drive circuit are attached.

Describing more specifically, the outer body 14 is made of a synthetic resin and includes a cylindrical projection formed with a cylindrical wall 14a, and a plurality of fittings 23 for receiving the electrical components 22 such as a resistor and a transistor. The cylindrical projection and the fittings 23 are formed on the same side of the substrate 20. On the opposite side of the substrate 20, there is formed a recess 24 with a flat bottom for receiving a wiring board 26. The wiring board 26 is formed from a tin galvanized steel sheet or a copper sheet. The depth of the recess 24 varies depending upon the thickness of the wiring board 26, but ranges from 1 mm to 3 mm. In this embodiment, a dial 12 is attached to the outer body 14 directly as different from FIG. 1 embodiment wherein the dial was attached to the arms 10 of the upper housing 4.

The wiring board 26 is fixed within the recess by a simple process of inserting tongues 25 formed on the wiring board 26 into mounting holes formed through the bottom of the recess 24 and then having them bent to lock the wiring board 26 as shown in FIG. 10. Alternatively, the wiring board 26 may be fixed to the bottom of the recess 24 by melting the bottom of the recess 24.

According to this embodiment shown in FIGS. 10 and 11, the outer body 14 is made of synthetic resin that is less expensive. The outer body 14 and the fittings 23 for the electrical components 22 are formed integrally on the substrate 20. The wiring board 26 is formed of the tin galvanized steel sheet or copper sheet that is less expensive and it is fixed within the recess 24 for establishing electric connection between the coils 6, 7 and electrical components 22. They result in a cost reduction in manufacturing the meters.

Besides, since the meter main body, the associated electrical components 22, and the wiring board 26 are installed on the substrate 20 by simple process of insertion, the assembly operation can be automated. This also causes a cost reduction.

What is claimed is:

1. A meter comprising:
a magnet;
a shaft attached to said magnet for integral rotation;
a pointer attached to said shaft;
means for rotatably carrying said shaft;
a plurality of coils mounted on said rotatably carrying means and surrounding said magnet;
an outer body having a wall surrounding said plurality of coils, said wall defining a bore; and
a layered cylindrical insert comprising a strip plate of amorphous metal alloy concentrically wound a plurality of times about a common axis in a non-helical manner, such that each layer is concentrically disposed about, and substantially covers, a preceding layer, said insert being held in said bore in engagement with said wall of said outer body by the bending stress applied to the cylindrical insert and surrounding said plurality of coils.

2. A meter as claimed in claim 1, wherein said outer body is made of one of a non-magnetic material or a magnetic material that has a coercive force higher than a predetermined level.

3. A meter as claimed in claim 2, including a ring made of a non-magnetic material, said ring being disposed within said insert and arranged to press said insert against said wall.

4. A meter as claimed in claim 2, wherein said outer body is formed with projecting means projecting inwardly from said wall and forming an objection abutting against said insert.

5. A meter as claimed in claim 2, wherein said strip of plate has one end adhered to the adjacent portion of said strip of plate.

6. A meter as claimed in claim 1, wherein said outer body is formed, by drawing, from a blank of a magnetic material that has a coercive force higher than a predetermined level, and said outer body is free from the magnet annealing which is usually employed for elimination of residual stress occurring after forming said outer body.

7. A meter as claimed in claim 2, wherein said wall is cylindrical and said bore is cylindrical, and said strip of plate has one end so shaped as to reduce structural rigidity toward a margin thereof to thereby form a substantially true cylindrical shape when the plate is concentrically wound.

8. A meter as claimed in claim 1, wherein said outer body includes an integral substrate and is made of a synthtic resin, said substrate having formed on one side thereof a cylindrical portion formed with said wall, and on the opposite side thereof a recess for receiving a wiring board.

9. A meter as claimed in claim 8, wherein said wiring board is formed from one of a tin galvanized steel sheet and a copper sheet.

* * * * *